(12) United States Patent
Itou

(10) Patent No.: US 11,810,758 B2
(45) Date of Patent: Nov. 7, 2023

(54) PLASMA PROCESSING APPARATUS

(71) Applicant: TOKYO ELECTRON LIMITED, Tokyo (JP)

(72) Inventor: Satoshi Itou, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/175,988

(22) Filed: Oct. 31, 2018

(65) Prior Publication Data

US 2019/0131108 A1    May 2, 2019

(30) Foreign Application Priority Data

Nov. 1, 2017  (JP) ................. 2017-212173

(51) Int. Cl.
| | | |
|---|---|---|
| *C23C 16/00* | (2006.01) | |
| *H01L 21/306* | (2006.01) | |
| *H01J 37/32* | (2006.01) | |
| *C23C 16/517* | (2006.01) | |
| *H01L 21/3065* | (2006.01) | |
| *H01J 27/16* | (2006.01) | |
| *H01L 21/67* | (2006.01) | |

(52) U.S. Cl.
CPC ........ *H01J 37/3211* (2013.01); *C23C 16/517* (2013.01); *H01J 27/16* (2013.01); *H01J 37/321* (2013.01); *H01J 37/3266* (2013.01); *H01L 21/30655* (2013.01); *H01L 21/67109* (2013.01)

(58) Field of Classification Search
CPC ............... H01J 37/321; H01J 37/3211; H01J 37/32119; H01J 37/32128; H01J 37/32137; H01J 37/32146; H01J 37/32155; H01J 37/32165; H01J 37/32174; H01J 37/32183; H05H 2001/4652; H05H 2001/466; H05H 2001/4667
USPC ........ 156/345.48, 345.49; 118/723 I, 723 IR, 118/723 AN; 315/111.51
See application file for complete search history.

(56) References Cited

U.S. PATENT DOCUMENTS

| | | | |
|---|---|---|---|
| 6,268,700 B1 * | 7/2001 | Holland ................ | H01J 37/321 118/723 AN |
| 6,409,933 B1 * | 6/2002 | Holland ................ | H01J 37/321 343/893 |
| 6,685,798 B1 | 2/2004 | Holland et al. | |

(Continued)

FOREIGN PATENT DOCUMENTS

| | | | |
|---|---|---|---|
| JP | 2003124191 | * | 4/2003 |
| KR | 20080107758 | * | 12/2008 |

*Primary Examiner* — Luz L Alejandro Mulero
(74) *Attorney, Agent, or Firm* — WEIHROUCH IP

(57) ABSTRACT

A plasma processing apparatus includes a chamber having a space therein and configured to process a target object loaded into the space by plasma generated in the space; a gas supply unit configured to supply a processing gas into the space of the chamber; a high frequency antenna having a plurality of lines adjacent to each other and configured to generate the plasma in the space by an induced electric field generated in the space by a current flowing in the lines; and a plurality of holders configured to hold the lines of the high frequency antenna. The holders are arranged on the respective lines of the high frequency antenna such that the adjacent holders are spaced from each other by a gap of a predetermined distance or more.

21 Claims, 23 Drawing Sheets

(56) References Cited

U.S. PATENT DOCUMENTS

| | | | |
|---|---|---|---|
| 2002/0041160 A1* | 4/2002 | Barnes | H01J 37/321 |
| | | | 315/111.21 |
| 2004/0149387 A1* | 8/2004 | Kim | H01J 37/321 |
| | | | 156/345.48 |
| 2005/0145341 A1* | 7/2005 | Suzuki | H01J 37/321 |
| | | | 156/345.49 |
| 2006/0121210 A1* | 6/2006 | Kim | H05H 1/46 |
| | | | 134/1.1 |
| 2010/0263797 A1* | 10/2010 | Setsuhara | C23C 16/509 |
| | | | 156/345.48 |
| 2014/0175055 A1* | 6/2014 | Sasagawa | B44C 1/227 |
| | | | 216/68 |
| 2014/0367045 A1 | 12/2014 | Long et al. | |

\* cited by examiner

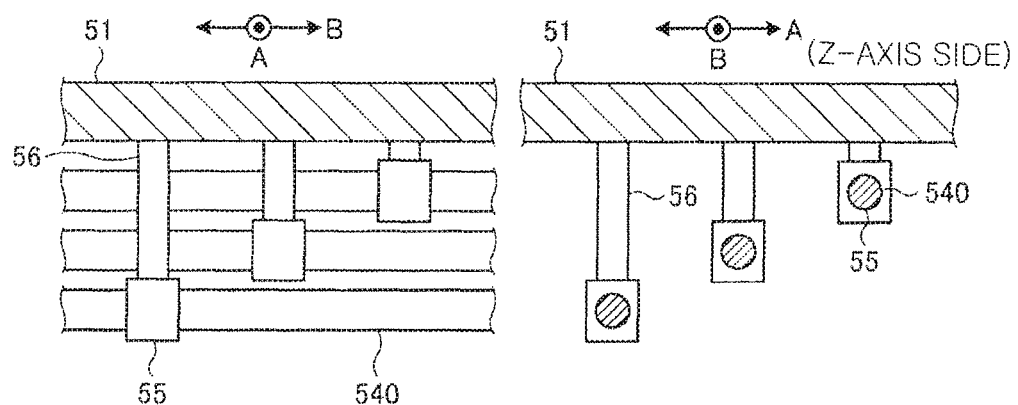

PLASMA PROCESSING APPARATUS

CROSS-REFERENCE TO RELATED APPLICATION

This application claims priority to Japanese Patent Application No. 2017-212173 filed on Nov. 1, 2017, the entire contents of which are incorporated herein by reference.

FIELD OF THE INVENTION

The present disclosure relates to a plasma processing apparatus.

BACKGROUND OF THE INVENTION

In manufacturing a semiconductor substrate or the like, processing such as etching, film formation or the like is performed on a substrate by using plasma. In this plasma processing, various plasma processing apparatuses such as a plasma etching apparatus, a plasma CVD (Chemical Vapor Deposition) apparatus and the like are used. In this plasma processing apparatus, a high frequency power is used to generate plasma.

As for a plasma processing apparatus using a high frequency power, there is known an ICP (inductively coupled plasma) processing apparatus for inducing a high frequency electric field in a chamber by a high frequency magnetic field generated by high frequency waves supplied to a coil and converting a processing gas into plasma by the induced high frequency electric field. The ICP processing apparatus can generate high-density plasma at a high vacuum level.

In the ICP processing apparatus, an antenna chamber is provided above a dielectric window constituting a ceiling wall of a chamber for accommodating a target object, and a high frequency antenna is provided in the antenna chamber. A line forming a high frequency antenna is wound in multiple turns and is held by a plurality of holders made of an insulator (see, e.g., U.S. Pat. No. 6,685,798).

Although the high frequency antenna in the antenna chamber is held by the holders, when the high frequency power is applied to the high frequency antenna, so-called creeping discharge in which discharge occurs along surfaces of the holders between adjacent lines may occur. If the creeping discharge occurs, the holders deteriorates, which may lead to dielectric breakdown of the holders or the like. Therefore, it is required to suppress the occurrence of the creeping discharge on the surfaces of the holders.

SUMMARY OF THE INVENTION

In accordance with an aspect, there is provided a plasma processing apparatus including a chamber, a gas supply unit, a high frequency antenna and a plurality of holders. The chamber has a space therein and is configured to process a target object loaded into the space by plasma generated in the space. The gas supply unit is configured to supply a processing gas into the space of the chamber. The high frequency antenna has a plurality of lines adjacent to each other and is configured to generate the plasma in the space by an induced electric field generated in the space by a current flowing in the lines. The holders are configured to hold the lines of the high frequency antenna. The holders are arranged on the respective lines of the high frequency antenna such that the adjacent holders are spaced from each other by a gap of a predetermined distance or more.

BRIEF DESCRIPTION OF THE DRAWINGS

The objects and features of the present disclosure will become apparent from the following description of embodiments, given in conjunction with the accompanying drawings, in which:

FIGS. 22A and 22B show an example of arrangement of the holders; and

DETAILED DESCRIPTION OF THE EMBODIMENTS

Figure 1:
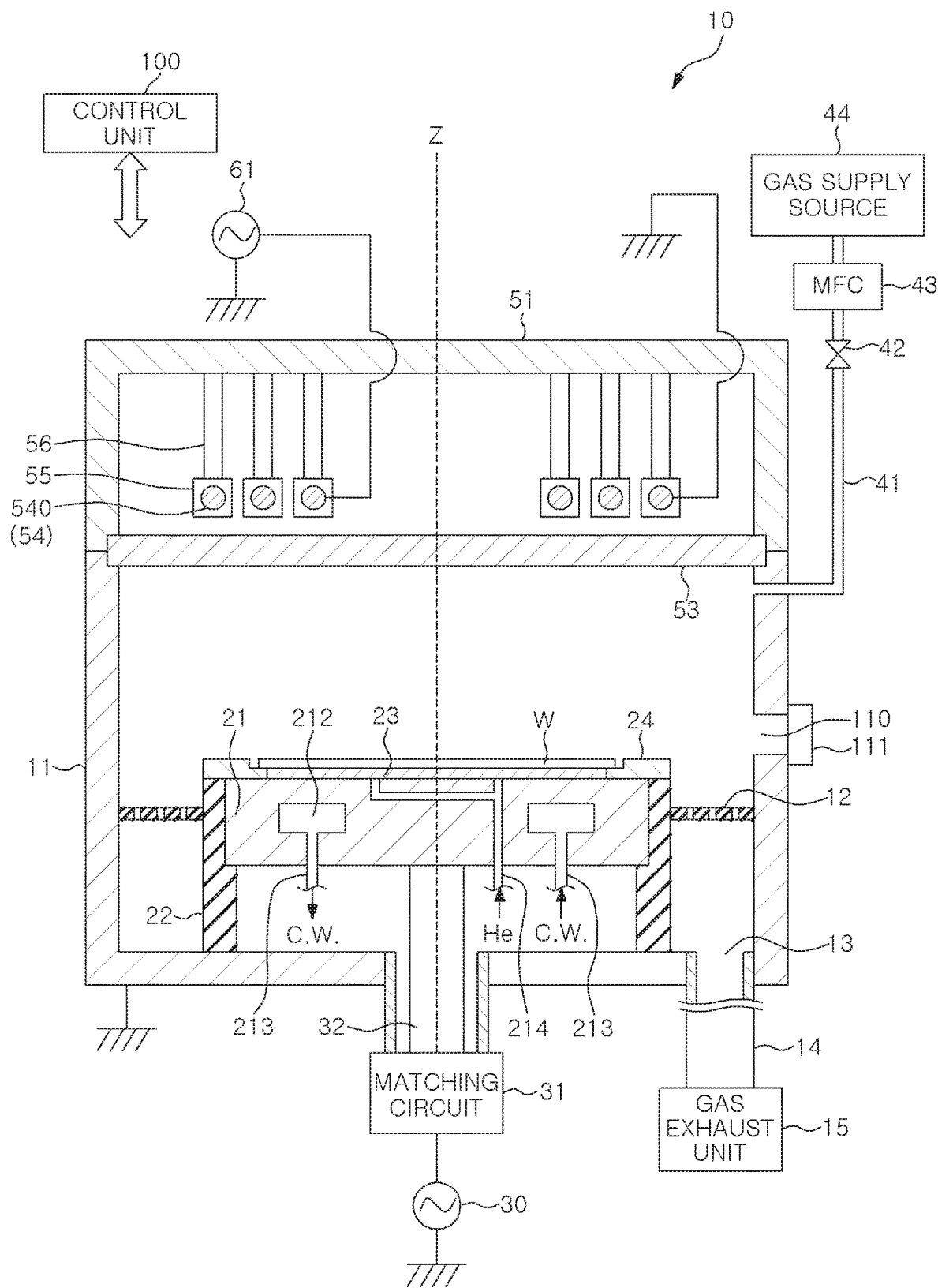
FIG. 1 is a cross sectional view showing a schematic example of a plasma processing apparatus.

A plasma processing apparatus in accordance with an embodiment includes a chamber, a gas supply unit, a high frequency antenna and a plurality of holders. The chamber has a space therein and is configured to process a target object loaded into the space by plasma generated in the space. The gas supply unit is configured to supply a processing gas into the space of the chamber. The high frequency antenna has a plurality of lines adjacent to each other and is configured to generate the plasma in the space by an induced electric field generated in the space by a current flowing in the lines. The holders are configured to hold the lines of the high frequency antenna. The holders are arranged on the respective lines of the high frequency antenna such that the adjacent holders are spaced from each other by a gap of a predetermined distance or more.

The holders may respectively hold the adjacent lines in a direction away from a center of an outer shape of the high frequency antenna, and two holders respectively holding two adjacent lines in the direction away from the center of the outer shape of the high frequency antenna may hold the two lines at different positions in a direction orthogonal to the direction away from the center of the outer shape of the high frequency antenna.

The high frequency antenna may be a planar coil in which the lines are wound in a substantially circular spiral shape.

The holders may respectively hold the adjacent lines in a diametrical direction of the high frequency antenna having a substantially circular outer shape, and two holders respectively holding two adjacent lines in the diametrical direction may hold the two lines at different positions in a circumferential direction of the high frequency antenna.

The plasma processing apparatus may further include a plurality of support members configured to respectively support the plurality of holders; a dielectric plate forming an upper portion of the chamber; and a shield member provided to cover the high frequency antenna disposed above the dielectric plate. Further, each of the support members may be provided for each one of the holders and supports each one of the holders with respect to at least one of the dielectric plate and the shield member.

The plasma processing apparatus may further include a plurality of support members configured to respectively support the plurality of holders; a dielectric plate forming an upper portion of the chamber; and a shield member provided to cover the high frequency antenna disposed above the dielectric plate, and each of the support members is provided for a predetermined number of holders and supports the predetermined number of holders with respect to at least one of the dielectric plate and the shield member.

Each of the support members may include a first support member configured to support the holders with respect to the dielectric plate; and a second support member extending from the first support member in a plane direction of the dielectric plate. Further, a lower end of the first support member may be in contact with an upper surface of the dielectric plate, and the second support member may be fixed to the shield member.

The plasma processing apparatus may further include: a dielectric plate forming an upper portion of the chamber; and a shield member provided to cover the high frequency antenna disposed above the dielectric plate. Further, each of the holders may include a first holder configured to hold the line from the top while being fixed to the shield member; and a second holder configured to hold the line while being fixed to the dielectric plate.

A distance between two adjacent holders may be greater than a distance between two adjacent lines in the high frequency antenna.

Hereinafter, embodiments of a plasma processing apparatus of the present disclosure will be described in detail with reference to the accompanying drawings. However, the following embodiments are not intended to limit the present disclosure. The embodiments may be appropriately combined without contradicting processing contents.

First Embodiment (Configuration of Plasma Processing Apparatus 10)

FIG. 1 is a cross sectional view showing a schematic example of a plasma processing apparatus 10. The plasma processing apparatus 10 includes a chamber 11 formed of a conductor such as aluminum or the like. An opening 110 through which a semiconductor wafer W as an example of a target object is loaded and unloaded is provided at a side surface of the chamber 11. The opening 110 can be opened and closed by a gate valve 111. The chamber 11 is grounded.

A substantially disc-shaped susceptor 21 made of a conductive material such as aluminum or the like is provided at a substantially center of a bottom surface of the chamber 11. The susceptor 21 mounts thereon a semiconductor wafer W as a processing target. The susceptor 21 also serves as an electrode for attracting ions in the plasma (for bias). The susceptor 21 is supported by a substantially cylindrical susceptor support 22 made of an insulator. In the present embodiment, the central axis of the susceptor 21 supported by the susceptor support 22 is defined as the Z-axis.

A high frequency bias power supply 30 is connected to the susceptor 21 through a power feed rod 32 and a matching circuit 31. A high frequency power having a frequency of, e.g., 13 MHz is supplied from the high frequency power supply 30 to the susceptor 21. The frequency and the power level of the high frequency power supplied from the high frequency power supply 30 to the susceptor 21 are controlled by a control unit 100 to be described later.

An electrostatic chuck 23 for holding the semiconductor wafer W by an electrostatic attraction force is provided on an upper surface of the susceptor 21. A focus ring 24 is provided on an outer circumferential side of the electrostatic chuck 23 to surround a periphery of the semiconductor wafer W. The substantially disc-shaped semiconductor wafer W is mounted on the electrostatic chuck 23 such that the central axis thereof coincides with the Z-axis.

A flow path 212 through which a coolant, e.g., cooling water (C.W.) or the like, flows to control a temperature of the semiconductor wafer W is formed in the susceptor 21. The flow path 212 is connected to a chiller unit (not shown) through a pipe 213, and the coolant having a controlled temperature is supplied from the chiller unit to the flow path 212 through the pipe 213. The temperature of the coolant in the chiller unit is controlled by the control unit 100 to be described later.

Inside the susceptor 21, a gas supply path 214 for supplying a heat transfer gas, e.g., He gas or the like, is provided between an upper surface of the electrostatic chuck 23 and a backside of the wafer W. The gas supply path 214 penetrates through the electrostatic chuck 23. An upper end of the gas supply path 214 is opened on the upper surface of the electrostatic chuck 23.

The susceptor 21 is provided with lift pins that penetrate through the susceptor 21 in a vertical direction and are configured to protrude beyond and retract below the upper surface of the electrostatic chuck 23 to transfer the wafer W with respect to a transfer arm (not shown). The vertical movement of the lift pins is controlled by the control unit 100 to be described later.

An annular baffle plate 12 having a plurality of through-holes is provided between an outer wall of the susceptor support 22 and an inner wall of the chamber 11. A gas exhaust port 13 is formed on the bottom surface of the chamber 11, and connected to a gas exhaust unit 15 through a gas exhaust line 14. The gas exhaust unit 15 is controlled by the control unit 100 to be described later.

One end of a pipe 41 is connected to a sidewall of the chamber 11. The other end of the pipe 41 is connected to a gas supply source 44 via a valve 42 and an MFC (Mass Flow Controller) 43. The gas supply source 44 supplies a processing gas, e.g., $CF_4$ gas, chlorine gas or the like. A flow rate of the processing gas supplied from the gas supply source 44 is controlled by the MFC 43, and the processing gas is supplied at the controlled flow rate into the chamber 11 through the valve 42 and the pipe 41. The control of the flow rate by the MFC 43 and the control of supply of the processing gas into the chamber 11 and stop of the supply by the valve 42 are controlled by the control unit 100 to be described later. The gas supply source 44 is an example of a gas supply unit.

A disc-shaped dielectric window 53 made of a dielectric material, e.g., quartz or the like, is provided at an upper portion of the chamber 11. The dielectric window 53 serves as the upper portion of the chamber 11. The dielectric window 53 is an example of a dielectric plate. A space above the dielectric window 53 is covered with a cylindrical shield box 51 made of a conductor, e.g., aluminum or the like. The shield box 51 is grounded via the chamber 11. The shield box 51 is an example of a shield member.

At a position above the chamber 11, an antenna 54 is accommodated in a space surrounded by the dielectric window and the shield box 51. The antenna 54 is made of a conductor such as copper or the like. In the present embodiment, the antenna 54 is a planar coil, and a single conductor is wound in two or more turns in a substantially circular spiral shape in a plane (e.g., horizontal plane) orthogonal to the Z-axis. The antenna 54 has a plurality of lines 540 adjacent in a direction away from the center (i.e., the Z-axis in FIG. 1) of the outer shape of the antenna 54. The antenna 54 is an example of a high frequency antenna.

The antenna 54 is held by a plurality of holders 55. Each of the holders 55 is fixed to the shield box 51 through a support member 56. In the present embodiment, one support member 56 is provided for one holder 55. The holders 55 and the support members 56 are made of an insulator, e.g., polytetrafluoroethylene or the like.

The antenna 54 has one end connected to a high frequency power supply 61 and the other end that is grounded. The high frequency power supply 61 supplies a high frequency power for plasma generation having a frequency of, e.g., 27 MH, to the antenna 54. The antenna 54 generates a high frequency magnetic field by the high frequency power supplied from the high frequency power supply 61. A high frequency induced electric field is generated in the chamber 11 by the high frequency magnetic field generated by the antenna 54. Due to the induced electric field generated in the chamber 11, the processing gas supplied into the chamber 11 is excited, and plasma of the processing gas is generated in the chamber 11. Predetermined processing such as etching or the like is performed on the semiconductor wafer W on the electrostatic chuck 23 by ions or active species contained in the plasma. The plasma processing apparatus 10 in the present embodiment is an ICP plasma processing apparatus.

The plasma processing apparatus 10 further includes the control unit 100 for controlling the respective components of the plasma processing apparatus 10. The control unit 100 includes a memory such as a ROM (Read Only Memory), a RAM (Random Access Memory) or the like, and a processor such as a CPU (Central Processing Unit) or the like. Data such as recipes and the like, programs, and the like are stored in the memory in the control unit 100. The processor in the control unit 100 reads out and executes the program stored in the memory in the control unit 100 and controls the respective components of the plasma processing apparatus 10 based on the data such as the recipes and the like stored in the memory in the control unit 100.

(Arrangement of Holders 55)

Figure 2:
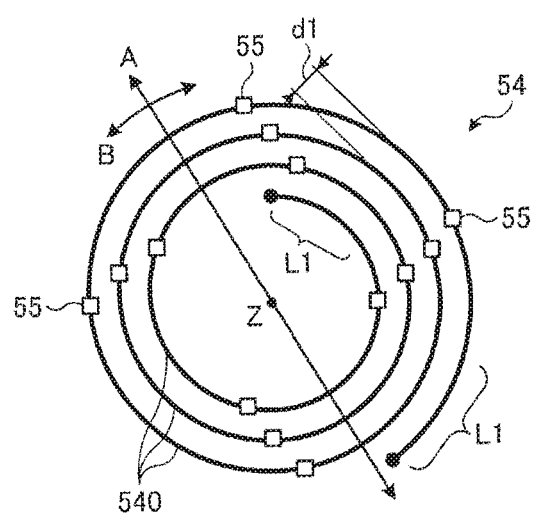
FIG. 2 shows an example of arrangement of holders in a first embodiment.
Figure 3:
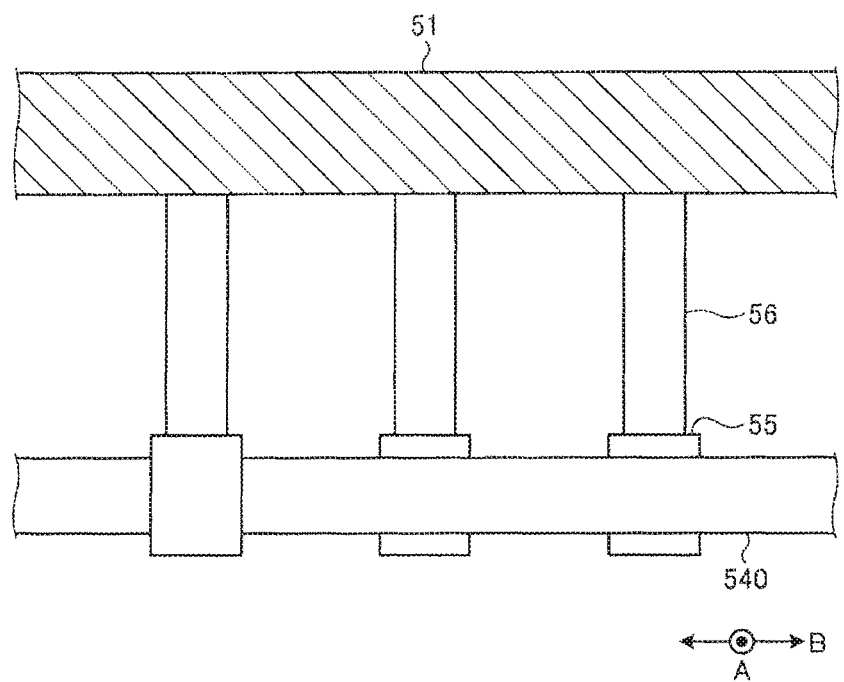
FIG. 3 is an enlarged view showing the example of the arrangement of the holders in the first embodiment.
Figure 4:
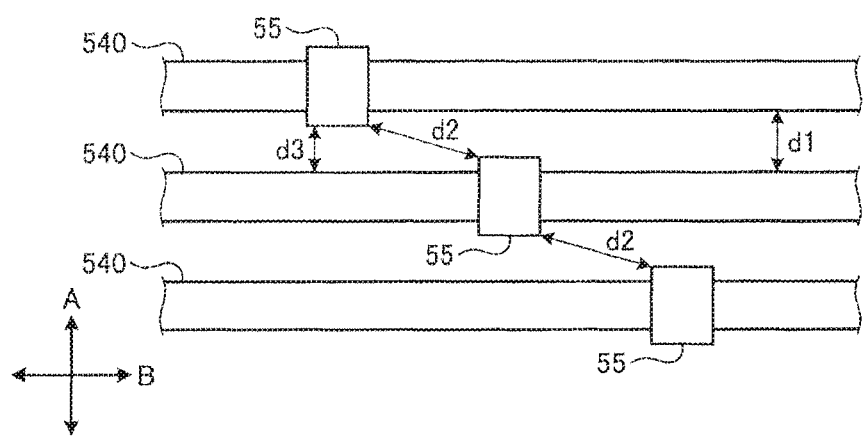
FIG. 4 is an enlarged view showing the example of arrangement of the holders in the first embodiment.

FIG. 2 shows an example of the arrangement of the holders 55 in the first embodiment. FIGS. 3 and 4 are enlarged views showing the example of the arrangement of the holders 55 in the first embodiment. FIGS. 2 and 4 show the antenna 54 viewed from the Z-axis direction. FIG. 3 shows the antenna 54 viewed from a direction orthogonal to the Z-axis.

In the present embodiment, the antenna 54 is wound in a substantially circular spiral shape as shown in FIG. 2, for example. In the present embodiment, the center of the antenna 54 coincides with the Z-axis. The antenna 54 is held by a plurality of holders 55 (13 holders 55 in the example of FIG. 2). Each of the holders 55 is fixed to the shield box 51 through each of the support members 56.

In FIG. 2, a direction (radial direction in the example of FIG. 2) away from the center of the antenna 54 having a substantially circular outer shape is defined as "A direction", and a direction (circumferential direction in the example of FIG. 2) orthogonal to the direction away from the center of the antenna 54 is defined as "B direction". In the present embodiment, the antenna 54 is wound around the Z-axis in two or more turns in a substantially circular spiral shape. Therefore, the antenna 54 has a plurality of lines 540 adjacent to each other in the A direction.

As shown in FIG. 2, for example, the holders 55 hold the lines 540 adjacent in the A direction. Further, two holders 55 holding two lines 540 adjacent in the A direction hold the two lines 540 at different positions in the B direction, as shown in FIGS. 2 to 4, for example.

Further, as shown in FIG. 4, for example, when a distance between two lines 540 adjacent in the A direction is set to d1, a distance d2 between two holders 55 holding the two lines 540 adjacent in the A direction is greater than the distance d1. Therefore, discharge hardly occurs between the two holders 55 holding the two lines 540 adjacent in the A direction. In a plurality of pairs of the holders 55, the distance d2 may be the same or may be different.

Further, as shown in FIG. 4, for example, in two lines 540 adjacent to each other in the A direction, a distance d3 between the holder 55 holding one line 540 and the other line 540 is set to be longer than ½ of the distance d1. Therefore, discharge hardly occurs between the holder 55 holding one line 540 and the other line 540.

Figure 5:
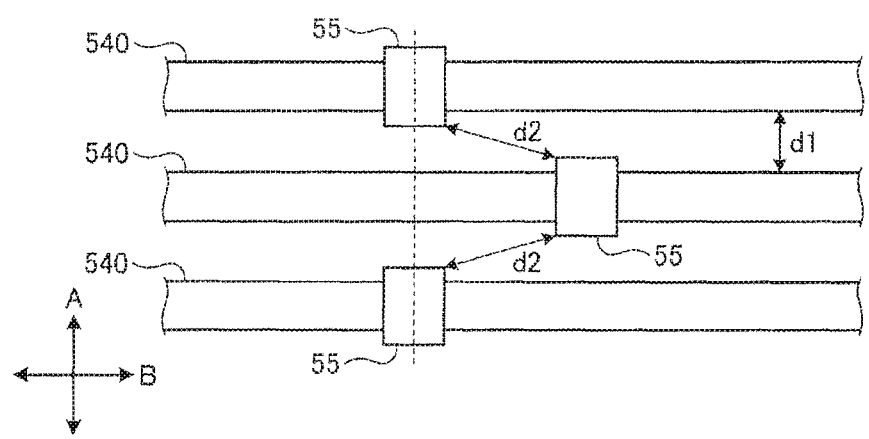
FIG. 5 is an enlarged view showing another example of the arrangement of the holders in the first embodiment.

The two holders 55 respectively holding the two lines 540 adjacent in the A direction may hold the lines 540 at different positions in the B direction. Therefore, among three or more holders 55, two holders 55 holding the lines 540 that are not adjacent in the A direction may hold the lines 540 at the same position in the B direction, as shown in FIG. 5, for example. FIG. 5 is an enlarged view showing another example of the arrangement of the holders 55 in the first embodiment.

In the present embodiment, the holders 55 are disposed at portions except a range of a predetermined length L1 from both ends of the antenna 54 as shown in FIG. 2, for example. A voltage generated in the antenna 54 may become high at both ends of the antenna 54 and in the vicinity thereof. Therefore, when the holders 55 are arranged in the vicinity of both ends of the antenna 54, discharge is likely to occur through the holders 55. Therefore, in the present embodiment, the holders 55 are disposed at portions except the range of the predetermined length L1 from both ends of the antenna 54. Accordingly, the occurrence of discharge through the holders 55 can be suppressed. The predetermined length L1 is, e.g., 5% of the total length of the antenna 54.

(Withstand Voltage Test)

Figure 6:
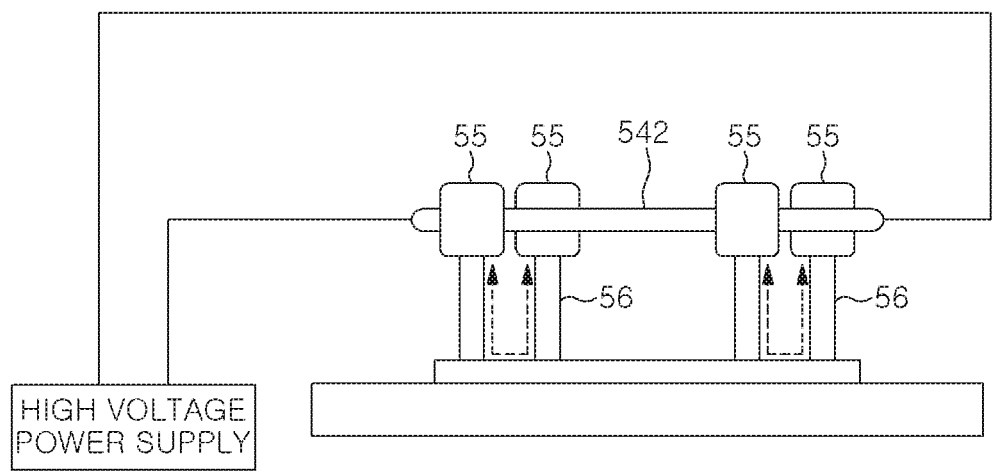
FIG. 6 shows a test environment in a withstand voltage test.

Next, a withstand voltage test was conducted on the holders 55 of the present embodiment. FIG. 6 shows a test environment in the withstand voltage test. In the withstand voltage test, a plurality of holders 55 holds two lines 542 corresponding to two adjacent lines 540, and each of the holders 55 is fixed to a base through a support member 56, as shown in FIG. 6, for example. The interval between the two lines 542 is set to be the same as that between two adjacent lines 540 in the antenna 54. Then, a magnitude of a DC voltage was measured until the discharge occurs between the lines 542 by increasing a negative DC voltage applied to a gap between the two lines 542.

Figure 7:
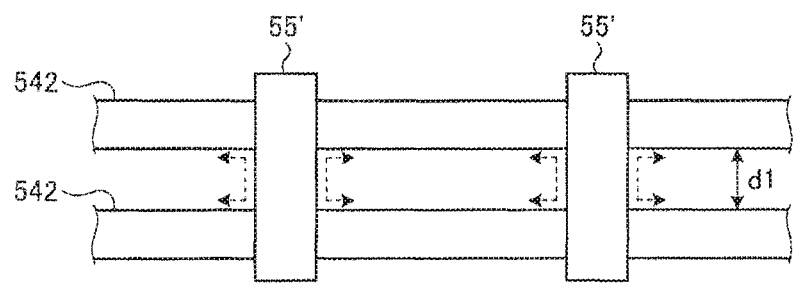
FIG. 7 showing an example of holders in a comparative example.

As a comparative example, the withstand voltage test was conducted on holders 55' as shown in FIG. 7, for example. FIG. 7 shows an example of the holders 55' in the comparative example. In the holders 55' of the comparative example, one holder 55' holds two lines 542. Therefore, an insulator forming the holder 55' is interposed between the two lines 542.

Figure 8:
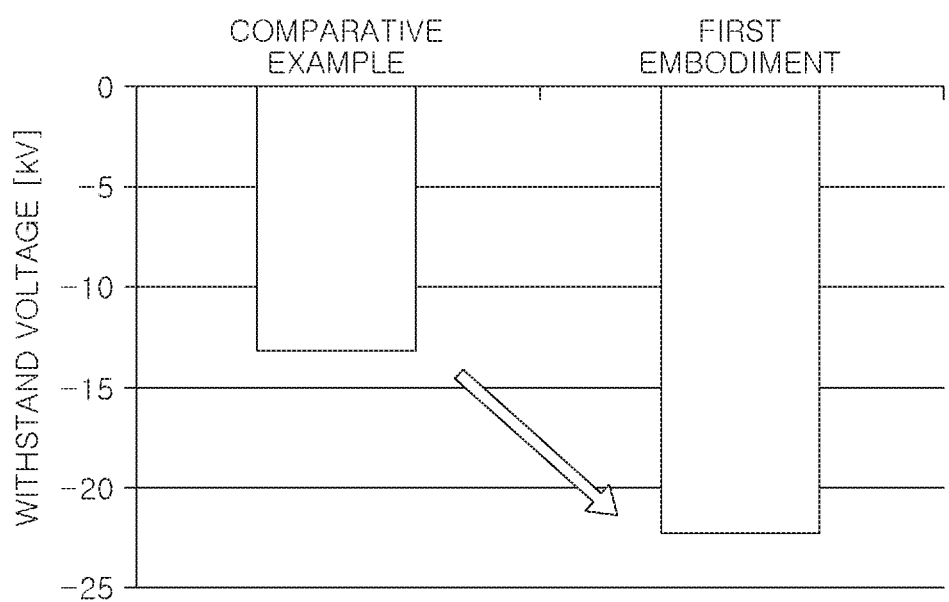
FIG. 8 shows results of the withstand voltage tests.

FIG. 8 shows results of the withstand voltage tests. As shown in FIG. 8, for example, in the holder 55 of the first embodiment, the withstand voltage was improved by about 1.7 times, compared to that in the holders 55' of the comparative example.

In the comparative example, the distance between the lines 542 through the surface of the holder 55' is the same as the distance d1 between the lines 542 and, thus, creeping discharge occurs along a path indicated by dashed arrows in FIG. 7. On the other hand, in the present embodiment, two adjacent holders 55 are spaced apart from each other by the distance d2, and the holder 55 holding one of the lines 542 is spaced apart from the other line 542 by the distance d3, as shown in FIGS. 4 and 5. Thus, the creeping discharge in the withstand voltage test occurs along a path indicated by dashed arrows in FIG. 6, for example, which is longer than the distance d1 between the two lines 542. Therefore, the holders 55 of the present embodiment make the occurrence of creeping discharge difficult compared to that in the comparative example.

As described above, in accordance with the plasma processing apparatus 10 of the present embodiment, it is possible to suppress the occurrence of discharge in the holders 55. Therefore, the deterioration of the holders 55 or the antenna 54 can be suppressed.

Second Embodiment

In the first embodiment, each one of the holders 55 is fixed to the shield box 51 through each one of the support members 56. On the other hand, in the second embodiment, a plurality of holders 55 is fixed to the shield box 51 by a single support member 56.

(Structure of Support Member 56)

Figure 9:
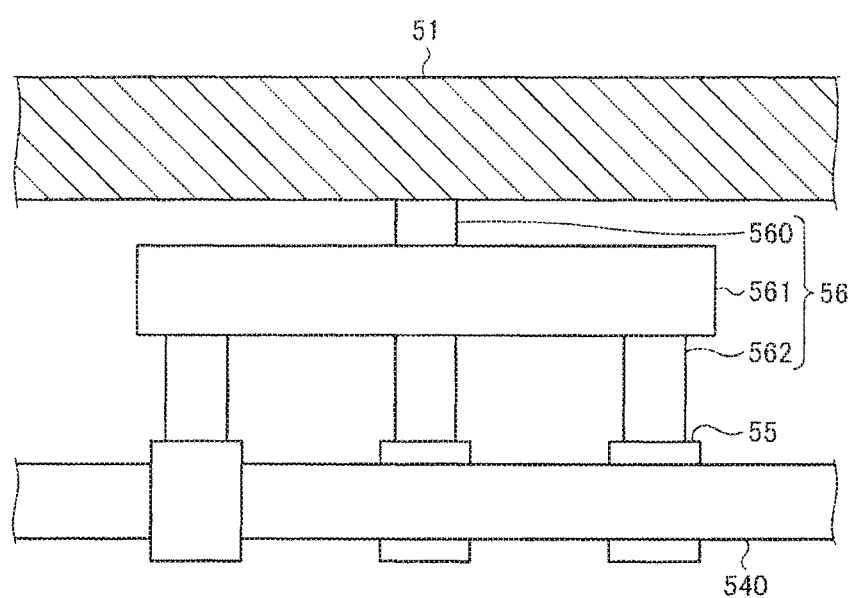
FIG. 9 shows an example of a support member in a second embodiment.

FIG. 9 shows an example of the support member 56 in the second embodiment. As shown in FIG. 9, for example, the support member 56 in the present embodiment has a fixing portion 560, a connecting portion 561, and a plurality of individual support portions 562. The fixing portion 560, the connecting portion 561, and the individual support portions 562 are made of an insulator, e.g., polytetrafluoroethylene or the like.

One individual support portion 562 is provided for one holder 55 and fixes the corresponding holder 55 to the connecting portion 561. A plurality of individual support portions 562 is fixed to the connecting portion 561. In the present embodiment, three or four individual support portions 562 are fixed to the connecting portion 561. However, the number of the individual support portions 562 fixed to the connecting portion 561 may be two, or may be five or more. One fixing portion 560 is provided for one connecting portion 561 and fixes the corresponding connecting portion 561 to the shield box 51.

Figure 10:
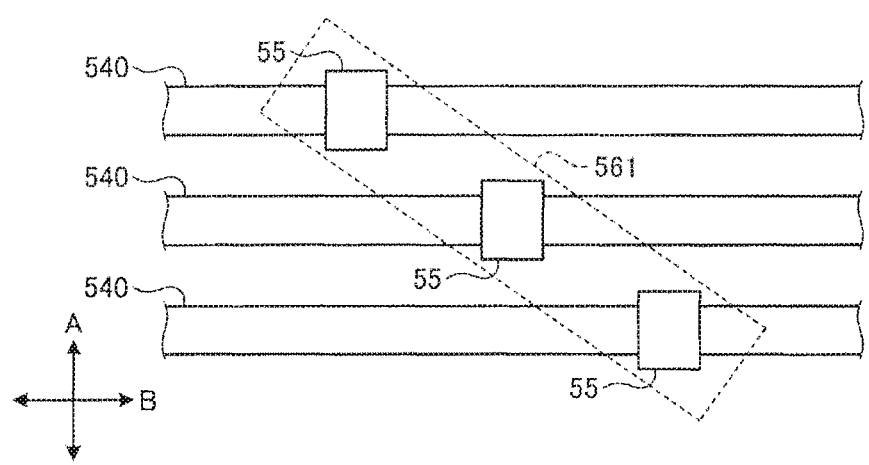
FIG. 10 shows an example of positional relation between the holders and a connecting portion.
Figure 11:
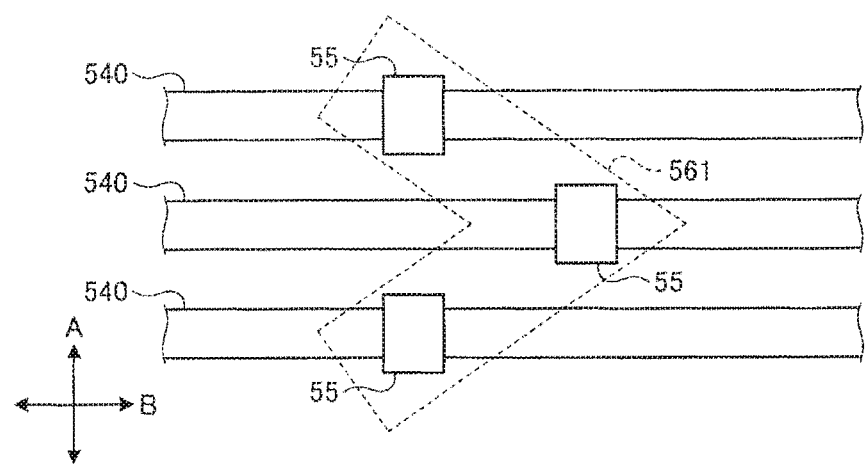
FIG. 11 shows another example of the positional relation between the holders and the connecting portion.

FIG. 10 shows an example of positional relation between a plurality of holders 55 and the connecting portion 561. The connecting portion 561 has a rectangular shape when viewed from the Z-axis direction, for example. As indicated by a dashed line in FIG. 10, for example, the connecting portion 561 is extended along the arrangement direction of the holders 55 fixed to the individual support portions 562 fixed to the connecting portion 561. When a plurality of holders 55 is arranged in a zigzag shape, the connecting portion 561 may be formed in a shape along the arrangement direction of the holders 55, as indicated by a dashed line in FIG. 11, for example. FIG. 11 shows another example of the positional relation between the holders 55 and the connecting portion 561.

In the present embodiment, the holders 55 are fixed to the shield box 51 by a single support member 56. Therefore, it is possible to reduce the number of fixing members such as screws and the like for fixing the holders 55 to the shield box 51, and also possible to reduce a fixing work of the holders 55 to the shield box 51.

Third Embodiment

Figure 12:
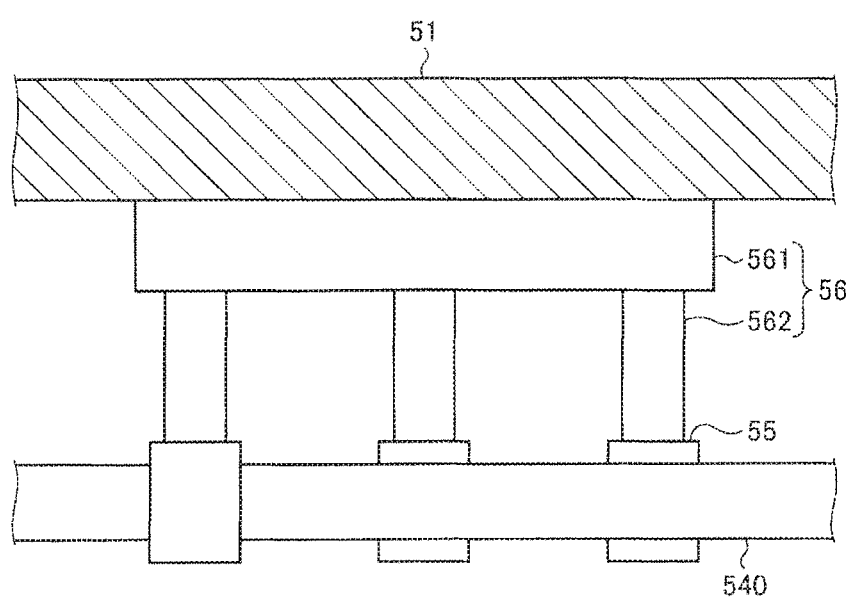
FIG. 12 shows an example of a support member in a third embodiment.

FIG. 12 shows an example of the support member 56 in the third embodiment. In the second embodiment, the connecting portion 561 is fixed to the shield box 51 through the fixing portion 560. On the other hand, in the third embodiment, the connecting portion 561 is directly fixed to the shield box 51 as shown in FIG. 12, for example.

Accordingly, the distance between the antenna 54 and the connecting portion 561 can be increased, thereby further suppressing the occurrence of creeping discharge on the surfaces of the individual support portions 562 and the connecting portion 561. Further, since the connecting portion 561 is fixed to the shield box 51, it is possible to increase a degree of freedom of the position of the fastening members such as screws and the like for fixing the connecting portion 561 to the shield box 51.

Fourth Embodiment

Figure 13:
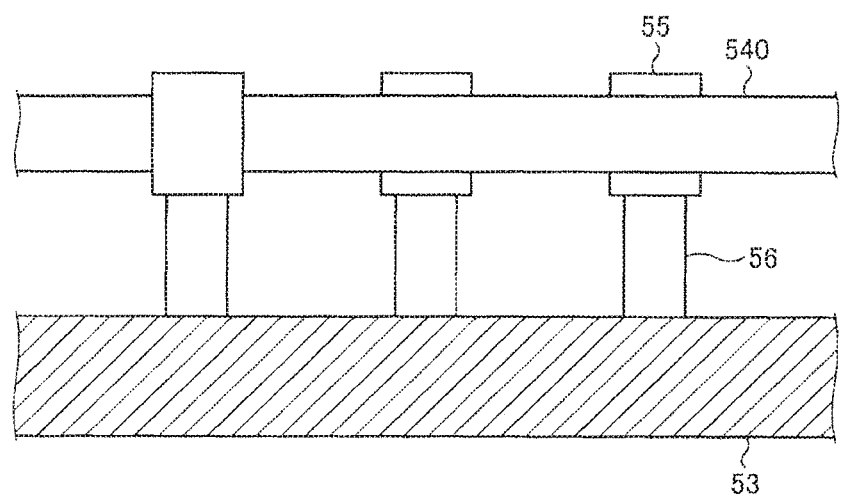
FIG. 13 shows an example of a supporting member in a fourth embodiment.

FIG. 13 shows an example of the support member 56 in the fourth embodiment. In the first embodiment, the support members 56 are fixed to the shield box 51. On the other hand, in the fourth embodiment, the support members 56 are fixed to the dielectric window 53 as shown in FIG. 13, for example.

In the present embodiment, the support members 56 are pressed against the dielectric window 53 by the weight of the antenna 54 and the holders 55. Therefore, when the support members 56 are fixed to the dielectric window 53, large clamping power for preventing the support members 56 from being separated from the dielectric window 53 is not required. Accordingly, the support members 56 can be fixed to the dielectric window 53 simply by inserting the support members 56 into positioning recesses formed on the surface of the dielectric window 53.

Fifth Embodiment

Figure 14:
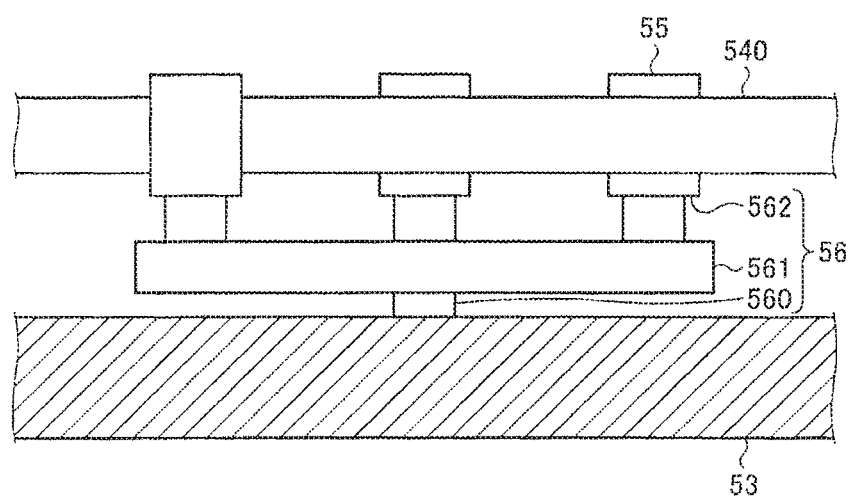
FIG. 14 shows an example of a support member in a fifth embodiment.

FIG. 14 shows an example of the support member 56 in the fifth embodiment. In the fourth embodiment, the support members 56 are fixed to the dielectric window 53. On the other hand, in the fifth embodiment, a plurality of holders 55 is fixed to the dielectric window 53 through a single support member 56 as shown in FIG. 14, for example.

In the present embodiment, the holders 55 are fixed to the dielectric window 53 through a single fixing portion 560. Therefore, the number of recesses, screw holes, and the like for fixing the holders 55 to the dielectric window 53, which are formed on the upper surface of the dielectric window 53, can be reduced. Accordingly, it is possible to suppress a decrease in a strength of the dielectric window 53 or an increase in a processing cost of the dielectric window 53.

Sixth Embodiment

Figure 15:
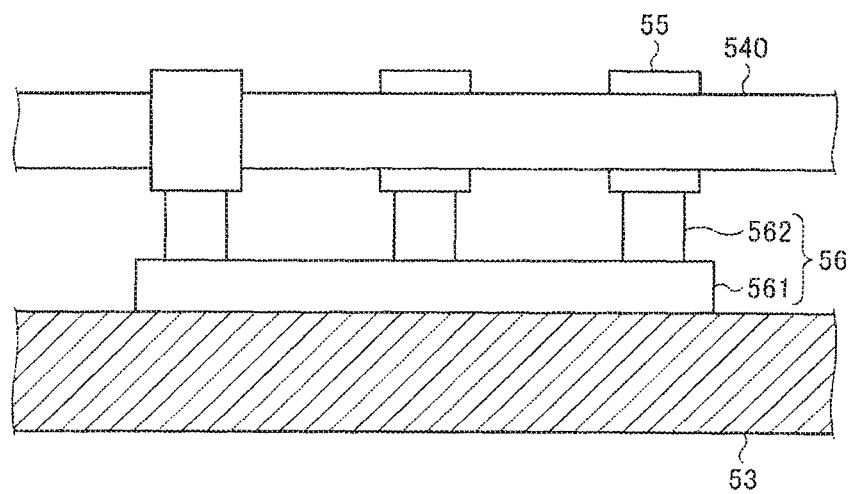
FIG. 15 shows an example of a support member in a sixth embodiment.

FIG. 15 shows an example of the support member 56 in the sixth embodiment. In the fifth embodiment, the connecting portion 561 is fixed to the dielectric window 53 through the fixing portion 560. On the other hand, in the sixth embodiment, the connecting portion 561 is fixed to the dielectric window 53 as shown in FIG. 15, for example.

Accordingly, the distance between the antenna 54 and the connecting portion 561 can be increased, thereby further suppressing the occurrence of creeping discharge on the surfaces of the individual support portions 562 and on the surface of the connecting portion 561. Further, a degree of freedom of the position of the recesses, the screw holes and the like for fixing the connecting portion 561 to the dielectric window 64 can be increased.

Seventh Embodiment

Figure 16:
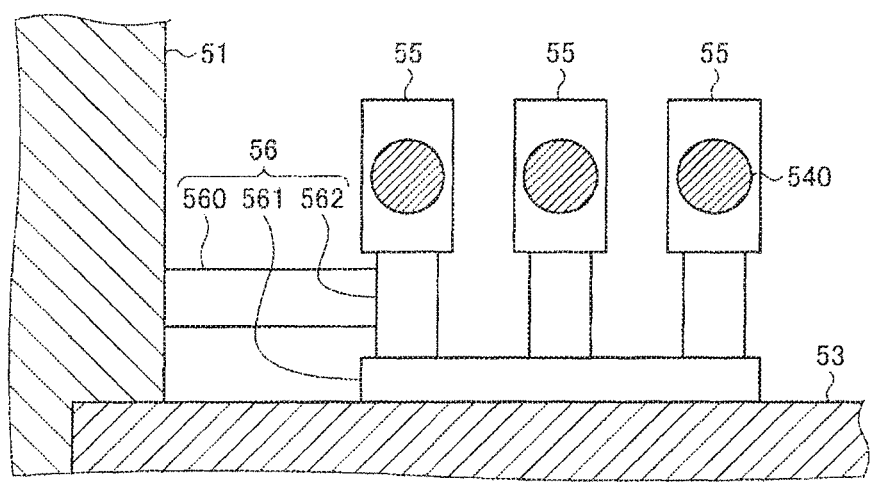
FIG. 16 shows an example of a support member in a seventh embodiment.

FIG. 16 shows an example of the support member 56 in the seventh embodiment. In the sixth embodiment, the connecting portion 561 is fixed to the dielectric window 53. On the other hand, in the seventh embodiment, the individual support portions 562 for fixing the holders 55 holding an outermost peripheral line 540 to the connecting portion 561 are connected to an inner surface of the shield box 51 through the fixing portion 560, as shown in FIG. 16, for example. The connecting portion 561 and the individual support portions 562 support the holders 55 with respect to the dielectric window 53. The fixing portion 560 extends in a plane direction of the dielectric window 53. The connecting portion 561 and the individual support portions 562 are an example of a first support member, and the fixing portion 560 is an example of a second support member.

In the present embodiment, while a lower surface of the connecting portion 561 is in contact with the upper surface of the dielectric window 53, the connecting portion 561 is not fixed to the dielectric window 53. The vertical positions of the lines 540 are defined by bringing the lower surface of the connecting portion 561 into contact with the upper surface of the dielectric window 53. Further, the horizontal positions of the lines 540 are defined by fixing the individual support portions 562 to the inner surface of the shield box 51 through the fixing portion 560. Therefore, it is unnecessary to provide recesses, protrusions and the like for determining the horizontal position of the connecting portion 561 on the upper surface of the dielectric window 53. Accordingly, it is possible to suppress the decrease in the strength of the dielectric window 53 or the increase in processing cost of the dielectric window 53.

The fixing portion 560 may fix the holders 55 holding the outermost peripheral line 540 to the inner surface of the shield box 51, or may fix the connecting portion 561 to the inner surface of the shield box 51.

Eighth Embodiment

Figure 17:
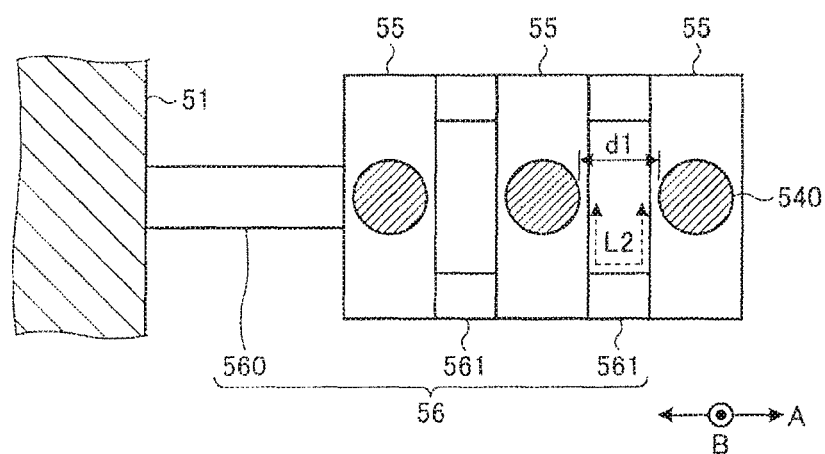
FIG. 17 shows an example of a support member in an eighth embodiment.

FIG. 17 shows an example of the support member 56 in the eighth embodiment. In the first to sixth embodiments, the lines 540 of the antenna 54 are fixed to the shield box positioned thereabove or the dielectric window 53 positioned therebelow. On the other hand, in the eighth embodiment, the lines 540 adjacent to the A direction, i.e., the diametrical direction of the antenna 54, are connected by the connecting portion 561, as shown in FIG. 17, for example. Then, the outermost peripheral holder 55 is fixed to the inner surface of the shield box 51 through the fixing portion 560. The lower ends of the holders 55 may be in contact with the upper surface of the dielectric window 53.

In the present embodiment as well, a creeping distance L2 between the holders 55 adjacent in the A direction is greater than the distance d1 between the lines 540 adjacent in the A direction. Therefore, the withstand voltage can be increased and the occurrence of creeping discharge can be suppressed, compared to the holders 55' of the comparative example (see FIG. 7).

In the example of FIG. 17, the holders 55 adjacent in the A direction are arranged at the same position in the B direction (direction perpendicular to the paper surface in FIG. 17). However, it is possible to further increase the creeping distance L2 and further suppress the occurrence of creeping discharge by arranging the holders 55 at different positions in the B direction, as shown in FIG. 4 or 5, for example.

Ninth Embodiment

Figure 18:
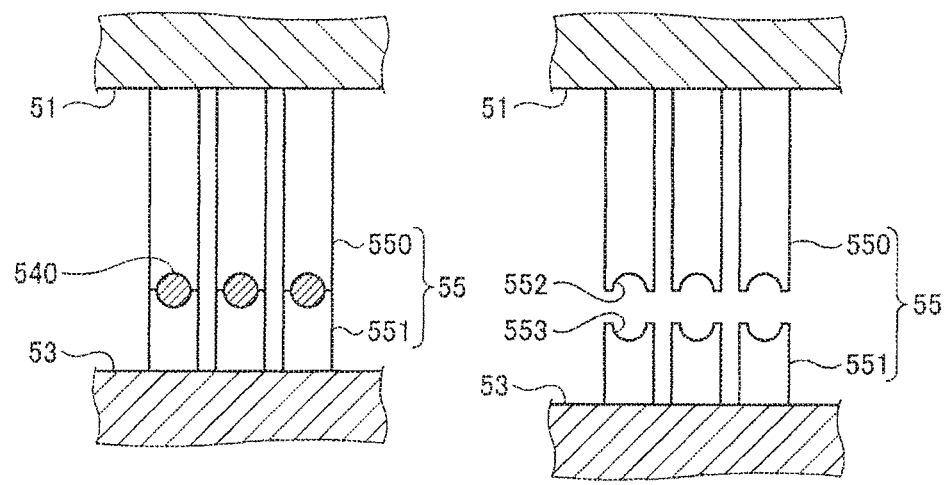
FIGS. 18A and 18B show an example of a support member in a ninth embodiment.

FIGS. 18A and 18B show an example of the holder 55 in the ninth embodiment. FIG. 18A shows a state in which the lines 540 are held by the holders 55. FIG. 18B shows a state in which the holders 55 are separated.

As shown in FIG. 18B, for example, the holder 55 in the ninth embodiment has an upper holder 550 and a lower holder 551. A recess 552 having a shape conforming to the outer periphery of the line 540 is formed at a lower end of the upper holder 550. An upper end of the upper holder 550 is fixed to the shield box 51. A recess 553 having a shape conforming to the outer periphery of the line 540 is formed at an upper end of the lower holder 551. A lower end of the lower holder 551 is fixed to the dielectric window 53. The upper holder 550 is an example of a first holder. The lower holder 551 is an example of a second holder.

As shown in FIG. 18A, for example, the upper holder 550 and the lower holder 551 hold the line 540 with respect to the shield box 51 and the dielectric window 53 by sandwiching the line 540 between the recess 552 and the recess 553. In other words, the upper holder 550 holds the line 540 from the top, and the lower holder 551 holds the line 540 from the bottom.

In the present embodiment as well, it is preferable to arrange the holders 55 at different positions in the B direction (direction perpendicular to the paper surface in FIGS. 18A and 18B), as shown in FIG. 4 or 5, for example. The holders 55 shown in FIGS. 18A and 18B hold the antenna 54 from the upper and the lower side. However, in another example, it is possible to insert the line 540 of the antenna 54 into a through-hole of the holder 55 and fix an upper end of the holder 55 to the shield box 51 in a state where a lower end of the holder 55 into which the line 540 is inserted is mounted on the dielectric window 53. In that case, the lower end of the holder 55 may be fixed to the dielectric window 53.

Other Embodiments

The present disclosure is not limited to the above-described embodiments, and various modifications can be made within the scope of the gist of the present disclosure.

For example, in the above-described embodiments, the ICP plasma processing apparatus 10 for generating a high frequency magnetic field in the chamber 11 by a high frequency power applied to the antenna 54 has been described as an example. However, the present disclosure is not limited thereto. For example, in a plasma processing apparatus 10 having a planar helical resonator, the techniques of the above-described embodiments can be used as a technique for holding the planar helical resonator.

Further, in a plasma processing apparatus 10 having a planar helical resonator and an absorption coil provided near the planer helical resonator and inductively coupled with the planar helical resonator, the techniques of the above-described embodiments can be used as a technique for holding the planar helical resonator and the absorption coil.

In the first and fourth embodiments, the holder 55 and the support member 56 are described as separate members. However, the holder 55 and the support member 56 may be formed as a single insulator.

Figure 19:
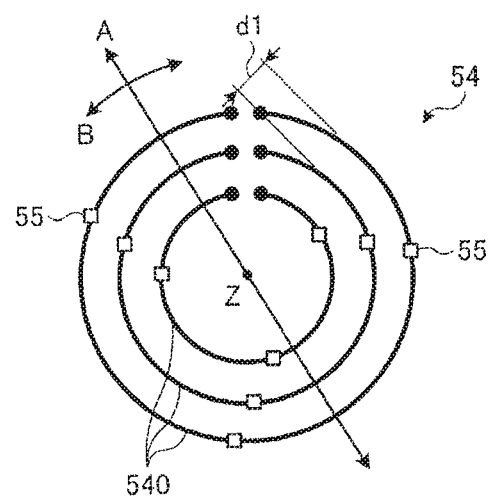
FIG. 19 shows an example of an antenna.

Although the antenna 54 of the above-described embodiments is a planar coil in which a single conductor is wound in two or more turns in a substantially circular spiral shape, the present disclosure is not limited thereto. For example, as shown in FIG. 19, the antenna 54 may be a planar antenna having a ring-shaped line 540 arranged along circumferences of a plurality of circles having different radii.

Figure 20:
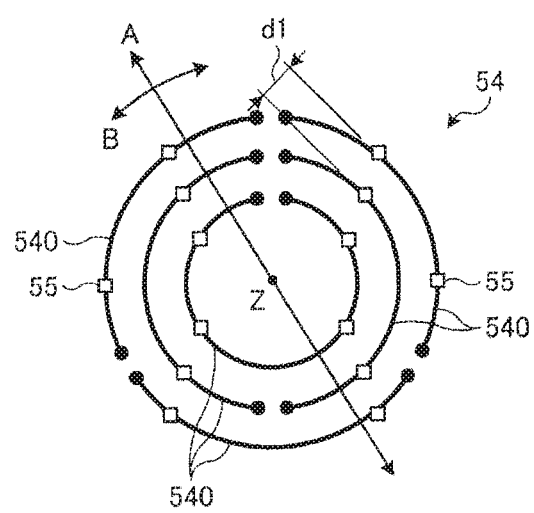
FIG. 20 shows another example of the antenna.

Alternatively, as shown in FIG. 20, for example, the antenna 54 may be a planar antenna including a plurality of lines 540 arranged along at least a part of circumferences of a plurality of circles having different radii. For example, in the antenna 54 shown in FIG. 20, for example, it is preferable to hold each line 540 by two or more holders 55.

Although the antenna 54 of the above-described embodiments is a planar coil, the present disclosure is not limited thereto. The antenna 54 may be, e.g., a solenoid coil or the like. Particularly, the antenna 54 may be a swirl-shaped coil whose outer shape becomes smaller toward the X-axis direction, as shown in FIG. 21, for example.

Figure 21:
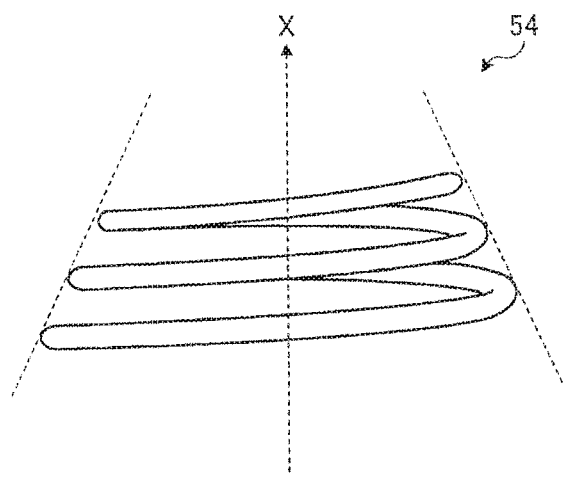
FIG. 21 shows still another example of the antenna.

When a swirl-shaped coil shown in FIG. 21, for example, is used as the antenna 54, the holders 55 are arranged on the lines 540 of the antenna 54, as shown in FIGS. 22A and 22B, for example. FIG. 22A shows an example of the arrangement of the holders 55 when viewing the antenna 54 from the A direction. FIG. 22B shows an example of the arrangement of the holders 55 when viewing the antenna 54 from the B direction.

Figures 23A, 23B:
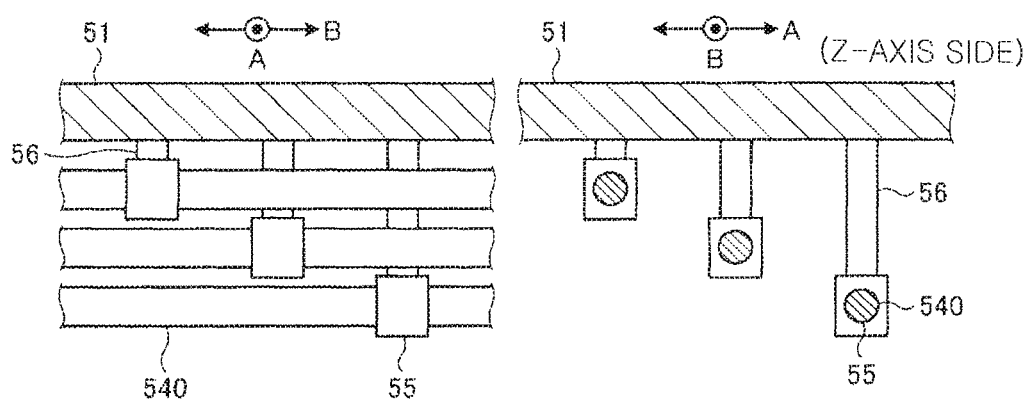
FIGS. 23A and 23B show another example of the arrangement of the holder.

When a coil having an inverted shape of the swirl-shaped coil shown in FIG. 21, for example, is used as the antenna 54, the holders 55 are arranged on the lines 540 of the antenna 54 as shown in FIGS. 23A and 23B, for example. FIG. 23A shows an example of the arrangement of the holders 55 when viewing the antenna 54 from the A direction. FIG. 23B shows an example of the arrangement of the holders 55 when viewing the antenna 54 from the B direction.

Although the antenna 54 of each of the embodiments described above has a substantially circular outer shape when viewed from the Z-axis direction, the present disclosure is not limited thereto. For example, the outer shape of the antenna 54 when viewed from the Z-axis direction may be a rectangular shape or a polygonal shape. In order to form a more uniform high frequency magnetic field in the chamber 11, it is preferable that the antenna 54 has an outer shape having point symmetry about the Z-axis when viewed from the Z-axis direction.

While the present disclosure has been shown and described with respect to the embodiments, it will be understood by those skilled in the art that various changes and modifications may be made without departing from the scope of the present disclosure as defined in the following claims.

What is claimed is:

1. A plasma processing apparatus comprising:
a chamber having a space therein and configured to process a target object loaded into the space by plasma generated in the space;
a gas supply source configured to supply a processing gas into the space of the chamber;
a high frequency antenna having a plurality of lines adjacent to each other and configured to generate the plasma in the space by an induced electric field generated in the space by a current flowing in the lines;
a plurality of holders configured to hold the lines of the high frequency antenna;
a plurality of support members configured to support the plurality of holders;
a dielectric plate forming an upper portion of the chamber; and
a shield member provided to cover the high frequency antenna, the shield member disposed above the dielectric plate,
wherein each of the holders holds only one of the lines and the holders are arranged on the respective lines of the high frequency antenna such that adjacent holders are spaced from each other by a gap of a predetermined distance, the predetermined distance between adjacent holders being greater than a distance between adjacent lines held by the adjacent holders,
the support members are each provided for holders of adjacent lines, and each support member supports the holders of the adjacent lines with respect to at least one of the dielectric plate and the shield member,
each of the support members has a connecting portion, the connecting portion extending along an arrangement direction of the holders of the adjacent lines when seen from above, and
the connecting portion is connected to at least three holders of the adjacent lines.

2. The plasma processing apparatus of claim 1, wherein the high frequency antenna is a planar coil in which the lines are wound in a substantially circular spiral shape.

3. The plasma processing apparatus of claim 1, wherein each of the plurality of support members includes:
a first support portion having the connecting portion and configured to support the holders of adjacent lines with respect to the dielectric plate; and
a second support portion extending from the first support portion in a plane direction of the dielectric plate,
wherein a lower end of the first support portion is in contact with an upper surface of the dielectric plate, and the second support portion is fixed to the shield member.

4. The plasma processing apparatus of claim 1, wherein the plurality of lines adjacent to each other include a first adjacent line which is adjacent to a second adjacent line, to provide first and second adjacent lines,
the holders correspondingly hold the first and second adjacent lines in a direction away from a center of the high frequency antenna, and
two holders correspondingly hold the first and second adjacent lines at different positions in the direction away from the center of the high frequency antenna, the two holders hold the first and second adjacent lines at different positions in a direction orthogonal to the direction away from the center of the high frequency antenna.

5. The plasma processing apparatus of claim 4, wherein
the holders correspondingly hold the first and second adjacent lines in a diametrical direction of the high frequency antenna having a substantially circular outer shape, and
the two holders correspondingly holding the first and second adjacent lines at different positions in the diametrical direction, and hold the first and second adjacent lines at different positions in a circumferential direction of the high frequency antenna.

6. The plasma processing apparatus of claim 4, wherein the two holders include a first holder holding only the first adjacent line and a second holder holding only the second adjacent line,
the first holder and the second holder are placed at different positions in an extension direction of the first adjacent line and the second adjacent line, and
the first holder is positioned between the center of the high frequency antenna and the second holder.

7. The plasma processing apparatus of claim 1, wherein the holders of the adjacent lines are disposed on a straight line when seen from above, and
an extending direction of the connecting portion is parallel to an extending direction of the straight line when seen from above.

8. The plasma processing apparatus of claim 1, wherein each of the support members further has a plurality of support portions, and
each of the support portions is provided for one holder and fixes a corresponding holder to the connecting portion.

9. The plasma processing apparatus of claim 1, wherein the connecting portion is directly fixed to the shield member such that the connecting portion and the shield member are in contact.

10. A plasma processing apparatus comprising:
a chamber having a plasma processing space;
an antenna having a substantially circular shape provided above the plasma processing space, the antenna including a first line and a second line;
a high frequency power supply connected to the antenna;
a first insulating holder configured to hold only the first line; and
a second insulating holder configured to hold only the second line,
at least one support member which supports the first insulating holder and the second insulating holder;
wherein the first line and the second line are adjacent in a radial direction of the antenna, and
a distance between the first insulating holder and the second insulating holder is greater than a distance between the first line and the second line.

11. The plasma processing apparatus of claim 10, wherein a distance between the first insulating holder and the second line is greater than half of the distance between the first line and the second line.

12. The plasma processing apparatus of claim 10, wherein the first insulating holder and the second insulating holder are provided at different positions in a circumferential direction of the antenna.

13. The plasma processing apparatus of claim 10, wherein the antenna includes a spiral planar coil having the first line and the second line.

14. The plasma processing apparatus of claim 10, wherein the antenna includes a first coil arranged along a circumference of a first circle having a first radius and a second coil arranged along a circumference of a second circle having a second radius different from the first radius,
each of the first coil and the second coil has two terminals, and
the first coil has the first line and the second coil has the second line.

15. The plasma processing apparatus of claim 10, wherein the antenna includes a swirl-shaped coil having the first line and the second line, and
a height of the first insulating holder is different from a height of the second insulating holder.

16. The plasma processing apparatus of claim 10, further comprising:
a dielectric window disposed between the plasma processing space and the antenna; and
a conductive shield box provided to cover the antenna,
wherein the first insulating holder and the second insulating holder are fixed to at least one of the dielectric window and the conductive shield member by way of the at least one support member.

17. The plasma processing apparatus of claim 16, wherein the at least one support member comprises:
a first insulating support member for fixing the first insulating holder to the conductive shield box; and
a second insulating support member for fixing the second insulating holder to the conductive shield box.

18. The plasma processing apparatus of claim 16, wherein the at least one support member comprises:
a connecting portion fixed to the conductive shield box;
a first insulating support portion fixing the first insulating holder to the connecting portion; and
a second insulating support portion fixing the second insulating holder to the connecting portion.

19. The plasma processing apparatus of claim 16, wherein the at least one support member comprises:
a first insulating support member fixing the first insulating holder to the dielectric window; and
a second insulating support member fixing the second insulating holder to the dielectric window.

20. The plasma processing apparatus of claim 16, wherein the at least one support member comprises:
a connecting portion fixed to the dielectric window;
a first insulating support portion fixing the first insulating holder to the connecting portion; and
a second insulating support portion fixing the second insulating holder to the connecting portion.

21. The plasma processing apparatus of claim 16, wherein the at least one support member comprises:
a first insulating support portion fixing the first insulating holder and the second insulating holder to the dielectric window; and
a second insulating support portion fixing the first insulating support portion to the conductive shield box.

* * * * *